(12) United States Patent
Nakajima

(10) Patent No.: US 6,793,981 B2
(45) Date of Patent: Sep. 21, 2004

(54) PROCESS FOR PRODUCING LAMINATED FILM, AND REFLECTION REDUCING FILM

(75) Inventor: Tatsuji Nakajima, Tokyo-to (JP)

(73) Assignee: Dai Nippon Printing Co., Ltd., Tokyo-to (JP)

(*) Notice: Subject to any disclaimer, the term of this patent is extended or adjusted under 35 U.S.C. 154(b) by 0 days.

(21) Appl. No.: 10/135,277

(22) Filed: Apr. 30, 2002

(65) Prior Publication Data

US 2002/0187371 A1 Dec. 12, 2002

Related U.S. Application Data

(62) Division of application No. 09/532,567, filed on Mar. 22, 2000, now abandoned.

(30) Foreign Application Priority Data

Mar. 23, 1999 (JP) .............................. 11-77488

(51) Int. Cl.[7] .............................. H05H 1/24; B05D 5/06
(52) U.S. Cl. ...................... 427/576; 427/579; 427/162
(58) Field of Search ................................ 427/576, 579, 427/162

(56) References Cited

U.S. PATENT DOCUMENTS

| 5,900,285 A | * | 5/1999 | Walther et al. ............. 427/491 |
| 6,110,544 A | * | 8/2000 | Yang et al. ................. 427/580 |
| 6,156,394 A | * | 12/2000 | Schultz Yamasaki et al. ........................ 427/536 |

* cited by examiner

*Primary Examiner*—Bret Chen
(74) *Attorney, Agent, or Firm*—Ladas & Parry

(57) ABSTRACT

The major object of the present invention is to provide a method for producing a laminated film, wherein a titanium oxide film can be formed at a temperature at which a polymeric film is not decomposed, elongated or deformed, while the laminated film of a titanium oxide film or of a titanium oxide film and a silica film, having optical performance usable as an anti-reflective film can be formed at a high rate, as well as an anti-reflective film produced by the method. To solve this major object, a laminated film of a titanium oxide film or of a titanium oxide film and a silica film is formed by plasma CVD method in the present invention.

6 Claims, 8 Drawing Sheets

| LOW-REFRACTIVE LAYER (SILICA LAYER) | 104.0 μm |
| TITANIUM OXIDE LAYER | 18.4 μm |
| INTERMEDIATE-REFRACTIVE LAYER | 88.0 μm |
| HARD COAT LAYER | 6.0 μm |
| PET FILM | 100.0 μm |

FIG. 3

| | |
|---|---|
| LOW-REFRACTIVE LAYER (SILICA LAYER) | 104.0 μm |
| TITANIUM OXIDE LAYER | 18.4 μm |
| INTERMEDIATE -REFRACTIVE LAYER | 88.0 μm |
| HARD COAT LAYER | 6.0 μm |
| PET FILM | 100.0 μm |

FIG. 4

| | |
|---|---|
| LOW-REFRACTIVE LAYER (SILICA LAYER) | 106.4 μm |
| TITANIUM OXIDE LAYER | 33.6 μm |
| LOW-REFRACTIVE LAYER (SILICA LAYER) | 38.8 μm |
| TITANIUM OXIDE LAYER | 20.8 μm |
| PET FILM | 100.0 μm |

| SILICA LAYER | 104.6 μm |
| TITANIUM OXIDE LAYER | 18.3 μm |
| INTERMEDIATE -REFRACTIVE LAYER | 88.0 μm |
| HARD COAT LAYER | 6.0 μm |
| PET FILM | 100.0 μm |

| SILICA LAYER | 103.4 μm |
| TITANIUM OXIDE LAYER | 26.8 μm |
| INTERMEDIATE -REFRACTIVE LAYER | 88.0 μm |
| HARD COAT LAYER | 6.0 μm |
| PET FILM | 100.0 μm |

PROCESS FOR PRODUCING LAMINATED FILM, AND REFLECTION REDUCING FILM

This application is a division of U.S. Ser. No. 09/532,567 filed Mar. 22, 2000, now abandoned which U.S. application is hereby incorporated herein by reference.

BACKGROUND OF THE INVENTION

The present invention relates to a method of producing a laminated film for forming a titanium oxide film etc. on a polymeric film by plasma CVD method as well as an anti-reflective film obtained by the method.

Transparent substrates such as glass and plastics are used in various displays such as liquid crystal displays, plasma displays and CRT used in computers, word processors, television sets and display plates, displays for instruments etc., rearview mirrors, goggles and window glasses. Letters, figures and other information are read through such transparent substrate, but if light is reflected by the surface of the transparent substrate, there arises the problem that the information is hardly read.

Accordingly, the substrate is endowed with anti-reflective functions. As the method of endowing it with anti-reflective functions, there is a method wherein an anti-reflective film consisting of inorganic compounds such as silicon oxide (also referred to hereinafter as "silica"), zirconium oxide, titanium oxide and magnesium fluoride is formed directly on a transparent substrate by various methods. In particular, titanium oxide has high refractive index and is thus preferably used in a highly refractive layer in an anti-reflective film. However, if an anti-reflective film containing titanium oxide etc. is to be formed directly on a transparent substrate, there are many limitations on the size, thickness and shape (curved surface etc.) of the formable transparent substrate.

Accordingly, a method has been proposed in which an anti-reflective film consisting of a titanium oxide film etc. is formed on a transparent polymeric film and the resulting polymeric film having the anti-reflective film formed thereon is attached to a substrate requiring anti-reflective functions. According to this system, the limitation on the shape of the transparent substrate can be significantly reduced, while the cost for conferring anti-reflective functions on the surface of the transparent substrate can also be reduced.

As the means of forming an anti-reflective film such as titanium oxide film etc., there are methods such as vacuum deposition, sputtering, thermal CVD method, and wet coating in a sol-gel method. However, when a titanium oxide film is to be formed on a polymeric film by these methods, there occur the following problems.

In vacuum deposition with titanium or titanium oxide as the raw material, the adhesion thereof to the substrate is poor. In sputtering using titanium and titanium oxide as the target, there arises the problem of e.g. a very low rate of formation of a titanium oxide film.

Because thermal CVD method is a method in which a thin film is formed by oxidization and decomposition of starting gas by heat energy of a substrate, the substrate should be heated at high temperature. For example, the temperature of the substrate for forming a titanium oxide film by thermal CVD method should be about 300 to 500° C. Since application of such high temperature to the polymeric film substrate causes decomposition and oxidization of the polymer compound therein, thermal CVD method cannot be used for forming a titanium oxide film on the polymeric film.

In the case where a titanium oxide film is formed by wet coating in a sol-gel method etc., it is difficult to provide the titanium oxide film as a thin film with constant qualities and regulated thickness. To use the titanium oxide film as an anti-reflective layer, a uniform thin film with a thickness of several tens nm to several hundred nm should be formed on a substrate with prescribed thickness without dispersion of the thickness; otherwise, the intended optical functions in design could not be demonstrated. However, if a titanium oxide film is formed as an anti-reflective layer by the means of wet coating in the sol-gel method etc., it is difficult to satisfy such strict conditions.

SUMMARY OF THE INVENTION

The present invention was made under these circumstances. In the case where an anti-reflective titanium oxide film etc. are to be formed on a polymeric film substrate, the object of the present invention is to provide a method of producing a laminated film, wherein the laminated film having optical performance usable as an anti-reflective film can be formed at a high rate and at a temperature at which the polymeric film is not decomposed, elongated or deformed, as well as an anti-reflective film obtained by the method.

To achieve this object, the present invention provides a method of producing a laminated film, wherein at least one layer of titanium oxide film is formed on a polymeric film having a temperature regulated in the range of −10 to 150° C. by means of a plasma CVD device capable of controlling the temperature of the polymeric film.

By using plasma CVD method in forming a titanium oxide film on a polymeric film, the surface temperature of the film can be maintained in the range of −10 to 150° C. whereby the titanium oxide film can be formed without causing decomposition, elongation and deformation of the film. Plasma CVD method is a method of forming a film by utilizing the phenomenon where plasma is generated in a reaction chamber in which a prescribed gas is introduced, whereby atomic or molecular radical species are generated to adhere to a solid surface, and in the surface reaction, further volatile molecules are often released and incorporated into the solid surface.

Further, in the present invention, at least one layer of silica film may be formed on the polymeric film having a temperature regulated in the range of −10 to 150° C. by means of the plasma CVD device.

In the present invention, this plasma CVD device is preferably a device including at least a reaction chamber to be introduced starting gas, a film forming drum capable of temperature control, and plasma generating means for generating plasma between the plasma generating means and the film forming drum, and in this plasma CVD device, a webbed polymeric film is continuously conveyed by the film forming drum to the reaction chamber having starting gas introduced into it thereby controlling the temperature of the polymeric film and simultaneously forming a film on the polymeric film.

By use of such a device, a titanium oxide film or a composite film consisting of a titanium oxide film and a silica film can be formed successively on the webbed polymeric film, particularly on the continuous length film. Further, the film is conveyed by the film forming drum and simultaneously the titanium oxide film etc. are formed on the film forming drum. Accordingly, the temperature of the polymeric film can be regulated by controlling the temperature of the film forming drum, thus permitting a film to be formed thereon under low-temperature conditions not causing deformation etc. of the film. The plasma generating means includes a coil, an antenna, and an electrode connected to a power source, or a window for introduction of electromagnetic wave.

In the plasma CVD device, a plurality of reaction chambers may be arranged along the outer periphery of the film forming drum. Arrangement of a plurality of reaction chambers is advantageous because if e.g. starting gas as the starting material of a titanium oxide film and starting gas as the starting material of a silica film are introduced respectively into the separate reaction chambers, a titanium oxide film and a silica film can be produced in one operation. Further, a plurality of film forming drums may also be arranged.

Further, the present invention provides an anti-reflective film wherein at least one layer of titanium oxide film having a refractive index of 2.0 or more to 2.9 or less (wavelength $\lambda$=550 nm) is laminated by plasma CVD method on a polymeric film.

Since the titanium oxide film laminated on the polymeric film has been formed by plasma CVD method, the resulting product is a high-quality anti-reflective film in which the titanium oxide film has necessary refractive index and the polymeric film is not deteriorated. In addition, the required optical characteristics of the titanium oxide film are that its refractive index is 2.0 or more (wavelength $\lambda$=550 nm). This is because if the refractive index is less than 2.0, the titanium oxide film cannot be perfectly formed, thus failing to satisfy the required criteria of a product as an anti-reflective film. On the other hand, the upper limit of the refractive index of the titanium oxide film in the present invention is defined to be 2.9 because usually the refractive index of the titanium oxide film cannot be 2.9 or more (wavelength $\lambda$=550 nm).

In the anti-reflective film of the present invention, a silica film may be laminated by plasma CVD method on the face of the titanium oxide film formed on the polymeric film.

In the present invention, the outermost layer is preferably the silica film described above. This is because the silica film has lower refractive index than that of the titanium oxide film and low reflectance, and thus its use as the outermost layer of the anti-reflective film brings about a high anti-reflective effect. Further, because the surface energy of the silica film is relatively low, it has stain resistance and water repellency. Accordingly, it can also confer stain resistance and water repellency on the anti-reflective film.

In the anti-reflective film of the present invention described above, it is preferable that a hard coat layer is formed on the polymeric film, and a layer formed by plasma CVD method is laminated on the hard coat layer. By providing the hard coat layer in this manner, the anti-reflective film can be endowed with scratch resistance.

Further, an intermediate-refractive layer is preferably formed on the hard coat layer. By forming the intermediate-refractive layer in this manner, the anti-reflective effect can be improved.

In the anti-reflective film of the present invention, the polymeric film is preferably a monoaxially or biaxially oriented polyester film or a triacetyl cellulose film. The polyester film is excellent in transparency and thermostability and can thus be used as an anti-reflective film in various utilities, and the triacetyl cellulose film does not have optical anisotropy and is thus suitable as an anti-reflective film like the polyester film.

By using plasma CVD method in forming a titanium oxide film, a silica film etc. on a polymeric film as described above in the present invention, the surface temperature of the film can be maintained in the range of $-10$ to 150° C. whereby the titanium oxide film can be formed without causing decomposition, elongation and deformation of the film. Further, the silica film has lower refractive index and reflectance than those of the titanium oxide film, and thus its use as the outermost layer of the anti-reflective film brings about a high anti-reflective effect. In addition, because the surface energy of the silica film is relatively low, it has stain resistance and water repellency. Accordingly, it can also confer stain resistance and water repellency on the anti-reflective film. As described above, the film formed according to the present invention is suitable for use as an anti-reflective film.

BRIEF DESCRIPTION OF THE DRAWINGS

FIG. 3 is a schematic sectional view showing the constitution of the laminated film in Example 5 as one embodiment of the anti-reflective film of the present invention.

FIG. 4 is a schematic sectional view showing the constitution of the laminated film in Example 6 as another embodiment of the anti-reflective film of the present invention.

DESCRIPTION OF THE PREFERRED EMBODIMENT

Figure 1:
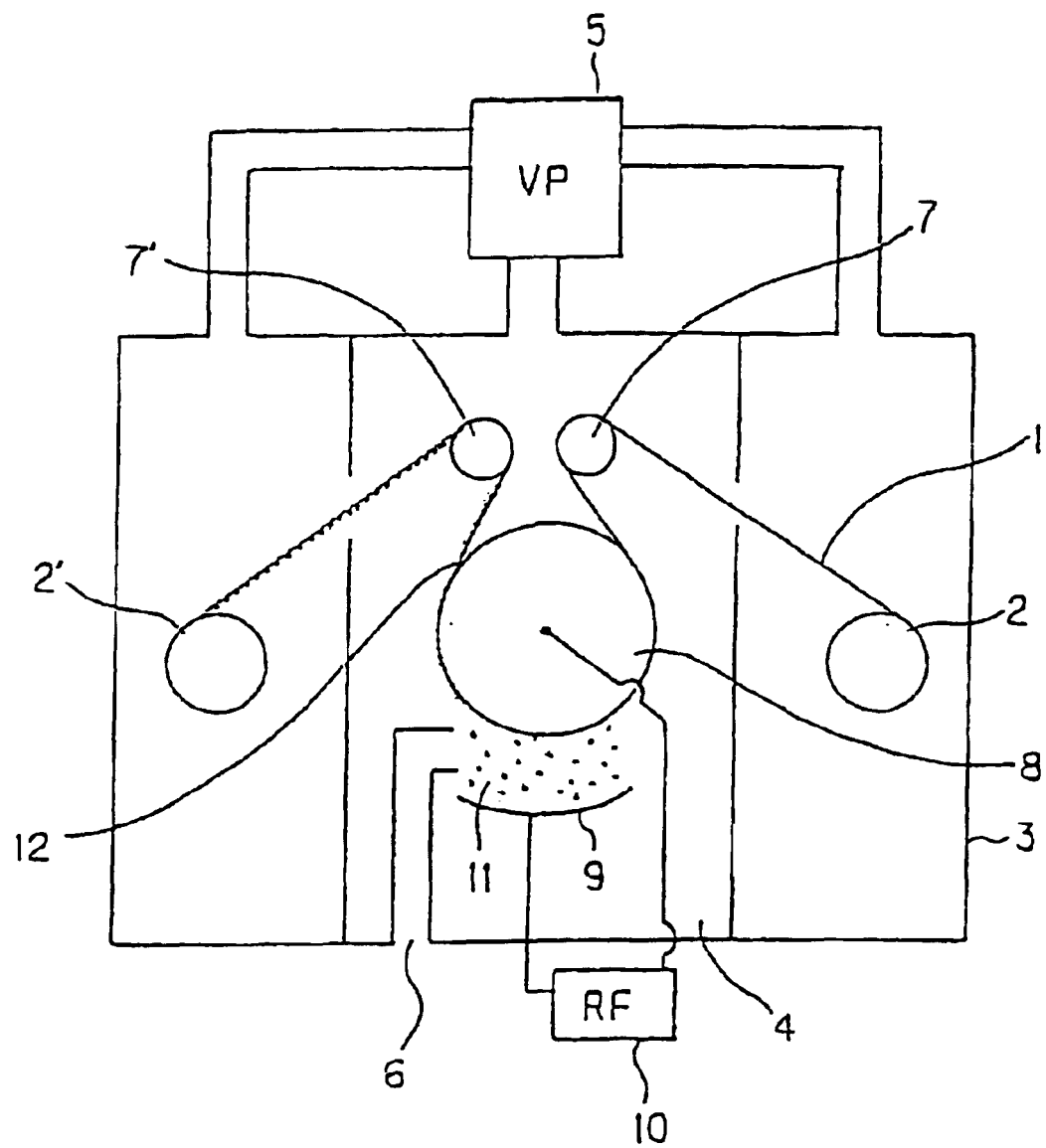
FIG. 1 is a schematic diagram explaining of a producing method of the present invention.

Hereinafter, the present invention will be described in detail. The method of producing a laminated film according to the present invention is characterized in that at least a titanium oxide film is formed on a polymeric film having a temperature regulated in the range of $-10$ to 150° C. by means of a plasma CVD device capable of controlling the temperature of the polymeric film.

The plasma CVD device used in the present invention is not particularly limited insofar as it can control the temperature the polymeric film, and there is no particular limitation on the frequency of a power source and the plasma forming system. The method for producing a laminated film wherein a titanium oxide film is formed on a polymeric film by means of such a plasma CVD device is described by reference to FIG. 1.

First, a webbed polymeric film 1 is unwound from a substrate let-off roll 2 and introduced into a reaction chamber 4 for plasma CVD method in a vacuum container 3. The vacuum container 3 is evacuated by a vacuum pump 5. An organic titanium compound gas and an oxygen gas are simultaneously fed to the reaction chamber 4 at a predetermined flow rate through a starting-gas inlet 6, and the inside of the reaction chamber 4 is filled always with these gases at a certain pressure.

Then, the polymeric film 1 which was unwound from the substrate let-off roll 2 and introduced into the reaction chamber 4 passes through a reverse roll 7 and is then wound on a film forming drum 8. While being synchronized with the rotation of the film forming drum 8, the polymeric film 1 is sent toward the direction of a reverse roll 7'. The temperature of the film forming drum 8 can be controlled, and the surface temperature of the polymeric film 1 is substantially equal to that of the film forming drum 8. Accordingly, the surface temperature of the polymeric film 1 on which titanium oxide is accumulated by plasma CVD method, that is, the film forming temperature in plasma CVD method, can be arbitrarily controlled. In this example, the film forming temperature in forming a titanium oxide film 12 on the polymeric film 1 by plasma CVD method is expressed in terms of the surface temperature of the film forming drum 8 during formation of the film.

RF voltage from a power source 10 is applied between an electrode 9 and the film forming drum 8. The power source can use a suitable frequency not only of radio wave but also in the range of direct current to microwave. RF voltage is applied between the electrode 9 and the film forming drum 8 whereby plasma 11 is generated in the vicinity of both the electrodes. Then, the organic titanium compound gas and the oxygen gas react with each other in plasma 11 thereby generating titanium oxide which is then accumulated on the polymeric film 1 wound on the film forming drum 8, to form the titanium oxide film 12 thereon. Thereafter, the polymeric film 1 having the titanium oxide film 12 formed thereon passes through the reverse roll 7' and is then wound on a substrate wind-up roll 2'.

In the present invention as described above, titanium oxide formed by chemical reaction between the organic titanium oxide compound gas and the oxygen gas in plasma 11 is accumulated as a titanium oxide film on the polymeric film 1 which is cooled to a suitable temperature by the film forming drum 8, and thus the titanium oxide film 12 can be formed without exposing the polymeric film 1 to high temperature causing elongation, deformation, curling etc. Further, the refractive index, thickness etc. of the titanium oxide film 12 to be formed can be controlled in a wide range in plasma CVD method in the present invention by controlling the flow rate and pressure of the starting gas, the discharge conditions and the feed rate of the polymeric film 1, and therefore, the film having desired optical characteristics can be obtained without changing the materials.

Hereinafter, the materials, conditions etc. used in the present invention are described in detail.

The materials which can be used as the organic titanium compound in the present invention are titanium alkoxides such as $Ti(i-OC_3H_7)_4$ (titanium tetra-i-propoxide), $Ti(OCH_3)_4$ (titanium tetra-methoxide), $Ti(OC_2H_5)_4$ (titanium tetraethoxide), $Ti(n-OC_3H_7)_4$ (titanium tetra-n-propoxide), $Ti(n-OC_4H_9)_4$ (titanium tetra-n-butoxide) and $Ti(t-OC_4H_9)_4$ (titanium tetra-t-butoxide). Among these, $Ti(i-OC_3H_7)_4$ (titanium tetra-i-propoxide) and $Ti(n-OC_4H_9)_4$ (titanium tetra-t-butoxide) are preferable because of high vapor pressure.

These organic titanium compounds are gasified in a liquid-gasifying unit and introduced in a gaseous state into the reaction chamber. An oxygen gas is also introduced to the reaction chamber. This oxygen gas serves as a reaction gas which reacts with the organic titanium compound gas to form titanium oxide. Further, there is also the case where a rare gas is used as a carrier gas for the organic titanium compound gas. The flow rate ratio of the oxygen gas to the organic titanium compound gas (oxygen gas/organic titanium compound gas) is preferably 5 or more. If it is less than 5, the amount of carbon mixed in the film formed is increased, thus decreasing the refractive index of the titanium oxide film to be formed. The suitable pressure in the reaction chamber is 1 Torr or less. If the pressure is more than 1 Torr, there arises the problem of a reduction in the refractive index and mechanical strength of the titanium oxide film to be formed. Further, the partial pressure of the organic titanium compound gas is preferably $10^{-1}$ Torr or less. If the partial pressure of the organic titanium compound gas is more than $10^{-1}$ Torr, there arises the problem of liquefaction of the organic titanium compound in the reaction chamber.

The polymeric film which can be used in the present invention should be transparent and includes e.g. triacetyl cellulose film, diacetyl cellulose film, acetate butyrate cellulose film, polyether sulfone film, polyacrylic film, polyurethane-based film, polyester film, polycarbonate film, polysulfone film, polyether film, trimethyl pentene film, polyether ketone film, acrylonitrile film and methacrylonitrile film. Further, a colorless and transparent film can be used preferably. In particular, a monoaxially or biaxially oriented polyester film is excellent in transparency and thermostability and can thus be used preferably. Triacetyl cellulose can also used preferably because it has no optical anisotropy. Usually, a polymeric film with a thickness of about 6 to 188 μm is preferably used.

In the present invention, the temperature of the film forming drum can be controlled, so the surface temperature of the polymeric film on which titanium oxide is accumulated by plasma CVD method, that is, the film forming temperature in plasma CVD method, can be arbitrarily controlled. This film forming temperature is in the range of −10 to 150° C. If this temperature is lower than −10° C., the refractive index of the titanium oxide film to be formed is lowered and thus not preferable. Further, if the film forming temperature exceeds 150° C., the temperature is higher than the temperature at which the substrate polymeric film usable in the present invention is thermally deformed, and thus there arises the problem of elongation, deformation, curling etc. during formation of the film.

Further, if the anti-reflective film is required to have such high qualities that its slight undulation, deformation and elongation are not allowable, or the substrate polymeric film is as thin as less than 10 μm so that it is easily elongated and deformed by heat, then the formation of a titanium oxide film by plasma CVD method is conducted particularly preferably at a temperature in the range of from −10° C. to the Tg of the polymeric film.

In the example shown in FIG. 1, the polymeric film is allowed to adhere to the film forming drum, and the temperature of this film forming drum is controlled whereby the temperature of the polymeric film is controlled. However, the present invention is not limited to this example, and there is no particular limitation insofar as the temperature of the polymeric film during formation of a film thereon by plasma CVD method can be controlled; for example, it is possible to use a method of controlling the temperature of the polymeric film by regulating the temperature of an atmosphere in the reaction chamber or a method of adjusting a temperature of the polymeric film to a predetermined temperature and then sending it into the reaction chamber.

The method of forming a silica film besides the titanium oxide film on the polymeric film which temperature is controlled in the range of −10 to 150° C. by means of the plasma CVD device is the same as for forming the titanium oxide film.

As the starting material for forming a silica film in the present invention, it is possible to employ Si-type compounds such as silane, disilane, hexamethyl disiloxane (HMDSO), tetramethyl disiloxane (TMDSO), methyl trimethoxy silane (MTMOS), methyl silane, dimethyl silane, trimethyl silane, diethyl silane, propyl silane, phenyl silane, tetramethoxy silane, octamethyl cyclotetrasiloxane, tetraethoxy silane etc.

Figure 2:
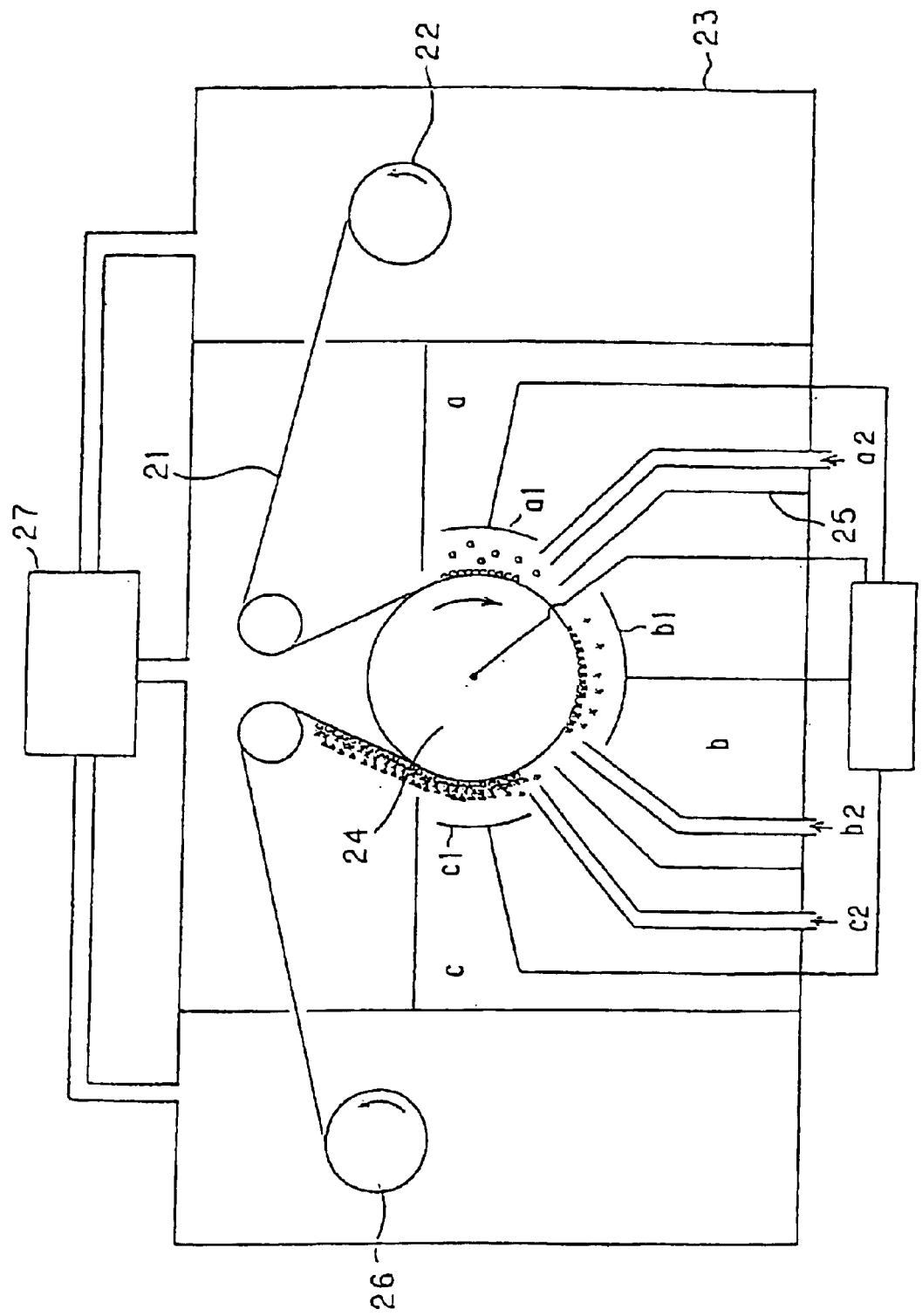
FIG. 2 is a schematic diagram explaining a producing method of the method of the present invention.

For preparation of titanium oxide and silica films, the plasma CVD device shown in FIG. 2 can also be used. This plasma CVD device is a plasma CVD device of capacity coupling type, and its fundamental structure and principle are the same as in the device shown in FIG. 1. Accordingly, in this device too, a webbed polymeric film 21 is unwound from a substrate let-off roll 22 and introduced into reaction chambers (a, b, c) in a vacuum container 23. Then, a prescribed film is formed on a film forming drum 24 in each reaction chamber and wound on a substrate wind-up roll 26.

The difference between the devices shown in FIGS. 1 and 2 is that in the device shown in FIG. 1, only one reaction chamber is arranged for forming a titanium oxide film on the film, while the plasma CVD device in FIG. 2 has a plurality of (three) reaction chambers. The respective reaction chambers (a, b, c) are formed by partition thereof with the partition wall 25. For the convenience of the description, the 3 reaction chambers are referred to as reaction chambers a, b and c respectively from the right. The respective reaction chambers are provided with electrode plates a1, b1 and c1 and the starting-gas inlets a2, b2, and c2, respectively.

The respective reaction chambers (a, b, c) are arranged along the outer periphery of the film forming drum 24. While being synchronized with the rotation of the film forming drum 24, the polymeric film on which a laminated film is to be formed is introduced into each of the reaction chambers where a laminated film is formed on the polymeric film on the film forming drum, as shown in the example in FIG. 1, and by arranging a plurality of reaction chambers as described above, a plurality of films can successively be laminated thereon. In the device shown in FIG. 2, the number of reaction chambers is 3, but the number of reaction chambers is not particularly limited and can be varied as necessary in the plasma CVD device used in the method of producing a laminated film according to the present invention.

According to the plasma CVD device as described above, different starting gases can be introduced respectively into the reaction chambers whereby films are formed independently in the respective reaction chambers. For example, when a laminated film consisting of a titanium oxide film and a silica film is to be formed on the polymeric film, gas containing an organic titanium compound is introduced into the reaction chamber a, while gas containing silicon is introduced into the reaction chambers b and c, so that a laminated film having a titanium oxide film and a silica film formed on the polymeric film 21 can have been formed when the polymeric film 21, after passing through the film forming drum 25, is wound on the substrate wind-up roll 26.

In the example described above, the gas introduced into the reaction chambers b and c is gas containing silicon. However, conditions such as the flow rate and pressure of the gas, the discharge conditions etc. in each reaction chamber can also be varied so as to change the characteristics of a silica film formed in each of the reaction chambers b and c. By the device, a titanium oxide film, a silica film, or the thickness, refractive index etc. of these films can be arbitrarily changed and combined.

It is not always necessary to introduce different starting gases into the respective reaction chambers. For example, gas containing an organic titanium compound is introduced into all of the reaction chambers a, b and c shown in FIG. 2, to form a titanium oxide film, and thereafter, all the gas introduced once into the reaction chambers a, b and c is evacuated, and then another gas containing silicon can be introduced into the reaction chambers a, b and c, to form a silica film on the titanium oxide film.

In the present invention, a polymeric film may be treated several times in the device as shown in FIG. 1 described above whereby a laminated film having a titanium oxide film and a silica film formed on the polymeric film is formed, or a polymeric film may be treated once in the device as shown in FIG. 2 described above whereby a laminated film having a titanium oxide film and a silica film formed on the polymeric film is formed. Further, a polymeric film may be treated several times in the device shown in FIG. 2 whereby a laminated film having titanium oxide films and silica films formed alternately over the polymeric film is formed.

Hereinafter, the anti-reflective film of the present invention will be described.

The anti-reflective film of the present invention is characterized by having at least one layer of titanium oxide film on a polymeric film with a refractive index of from 2.0 or more to 2.9 or less formed by the plasma CVD method. By controlling the temperature within the range of −10 to 150° C. during lamination of a titanium oxide film on a polymeric film, such an anti-reflective film can be made a high-quality anti-reflective film without deterioration etc. of the polymeric film.

Hereinafter, the anti-reflective film of the present invention will be described concretely by reference to the drawings. FIG. 3 shows one example of the anti-reflective film of the present invention. The anti-reflective film shown in this example is prepared by laminating a hard coat layer, an intermediate-refractive layer, a titanium oxide film and a silica film as a low-refractive layer in this order on a polyethylene terephthalate (PET) film as the polymeric film.

Further, the anti-reflective film of this invention comprises at least one layer each of titanium oxide film and silica film laminated on the polymeric film.

The position of the silica film formed therein is not particularly limited, and the silica film may be formed above or below the titanium oxide film, however preferably the anti-reflective film is constituted such that the silica film is formed as the outermost layer. The silica film has lower refractive index and reflectance than those of the titanium oxide film, and thus its use as the outermost layer of the anti-reflective film brings about a high anti-reflective effect. Further, because the surface energy of the silica film is relatively low, it has stain resistance and water repellency. Accordingly, it can also confer stain resistance and water repellency on the anti-reflective film.

In the anti-reflective film of the present invention, a laminated film containing one layer each of the titanium oxide film and the silica film may be formed as shown in FIG. 3. However, a laminated film consisting of plural layers e.g. two layers each of the titanium oxide film and the silica film may be formed on the polymeric film as shown in FIG. 4. By using such a constitution, the anti-reflective effect is improved.

In the present invention, a hard coat layer may further be provided above the polymeric film as shown in FIG. 3 and FIG. 4. By providing the hard coat layer, the mechanical strength of the anti-reflective film can be increased. The position of this hard coat layer formed therein is above the polymeric film, and for example, it is formed preferably as a lower layer on the titanium oxide film etc. formed by plasma CVD method.

In the anti-reflective film of this invention, an intermediate-refractive layer may further be formed as necessary as shown in FIG. 3. This intermediate-refractive layer has intermediate refractive index between the refractive index of the polymeric film, and the refractive index of the titanium oxide film formed by the plasma CVD method described above. By providing such an intermediate-refractive layer between the titanium oxide film and the polymeric film, the anti-reflective effect can further be improved.

Now, the respective layers constituting the anti-reflective film of the present invention will be described.

Titanium Oxide Film

The titanium oxide film in this invention is not particularly limited insofar as it is laminated on the polymeric film by plasma CVD method and its refractive index is in the range of from 2.0 or more to 2.9 or less ($\lambda$=550 nm).

Within this range, the refractive index of the titanium oxide film is preferably 2.0 to 2.5 ($\lambda$=550 nm), particularly preferably 2.0 to 2.3 ($\lambda$=550 nm). In forming the anti-reflective film, it is preferable that the refractive index of the titanium oxide film is determined relatively in relation to those of other laminated films therein, and the anti-reflective effect is demonstrated by the balance of the laminated film as a whole. For the general laminate structure, however, the refractive Index of the titanium oxide film is preferably in the range described above.

The anti-reflective film in the present invention is preferably the one wherein the titanium oxide film has been laminated by regulating the temperature of the polymeric film in the range of −10 to 150° C. The titanium oxide film laminated in this manner is excellent in film thickness distribution without the elongation or deformation of the substrate, and is suitable as an anti-reflective film.

Because the film can be continuously produced and the temperature of the polymeric film can be accurately controlled, the plasma CVD device is preferably a device for forming an anti-reflective film, including at least a reaction chamber in which a starting gas is introduced, a film forming drum capable of temperature control, and plasma generating means of generating plasma toward the film forming drum, wherein a webbed polymeric film is continuously conveyed by the film forming drum to the reaction chamber having starting gas introduced into it thereby controlling the temperature of the polymeric film and simultaneously forming a film on the polymeric film. Specifically, the plasma CVD device shown in FIG. 1 is preferable for forming the anti-reflective film having the titanium oxide film in it.

Further, the required optical characteristics of the titanium oxide layer in the anti-reflective film are that the refractive index of the titanium oxide film is 2.0 or more. However, the product even having a refractive index of 2.0 or more as optical characteristic may be regarded often as defective when the substrate is elongated or deformed. Accordingly, the film forming temperature is preferably controlled as described above in order to prevent the deformation of the substrate by heat and to prevent the obstruction to formation of a titanium oxide film by such deformation.

Low-refractive Layer

The low-refractive layer in the present invention, along with the titanium oxide film, is formed above the polymeric film as described above whereby the anti-reflective effect of the anti-reflective film is improved. The low-refractive layer is preferably a silica film formed by plasma CVD method, particularly preferably a silica film laminated in the anti-reflective film by regulating the temperature of the polymeric film within −10 to 150° C. The silica film laminated in this manner is excellent in film thickness distribution and suitable for use in the anti-reflective film. The low-refractive layer preferably has a refractive index in the range of 1.3 to 1.5. As the material in this range, it is possible to employ not only the silica film but also a film of magnesium fluoride or acid silicon fluoride. With respect to optical characteristics, magnesium fluoride and acid silicon fluoride are superior to the silica film in the physical properties required as the low-refractive material. However, magnesium fluoride etc. are inferior to the silica film in mechanical strength, moisture resistance etc. so that depending on the intended use, the means of laminating a high-strength layer or a barrier layer is preferably used in combination with such materials. In this respect, the silica film is comprehensively most preferable because it does not particularly require such means used in combination with magnesium fluoride etc.

For the same reasons as for the titanium oxide film described above, the anti-reflective film having the low-refractive layer in the present invention is produced preferably by the plasma CVD device including at least a reaction chamber having starting gas introduced into it, a film forming drum capable of temperature control, and plasma generating means of generating plasma toward the film forming drum, wherein for example a webbed polymeric film is continuously conveyed by the film forming drum to the reaction chamber in which starting gas is introduced, thus controlling the temperature of the polymeric film and simultaneously forming a film on the polymeric film.

In particular, the anti-reflective film having the low-refractive layer is formed preferably by the CVD device wherein at least two reaction chambers are arranged along the outer periphery of the film forming drum, specifically by the plasma CVD device as shown in FIG. 2 described above. By introducing a starting material of the titanium oxide film and a starting material of the low-refractive layer into the reaction chambers respectively, the anti-reflective film having both the titanium oxide film and the low-refractive layer can be formed in one treatment.

Polymeric Film

The polymeric film which can be used in the anti-reflective film of the present invention is not particularly limited insofar as it is a polymeric film which is transparent in the visible-light range. Specifically, the polymeric film described above in connection with the method of producing a laminated film can be used. In particular, a monoaxially or biaxially oriented polyester film is excellent in transparency and thermostability and is thus preferable in the present invention, and a polyethylene terephthalate (PET) film is particularly preferable. Further, a triacetyl cellulose film is also preferable for the anti-reflective film because it has no optical anisotropy.

Usually, a polymeric film having a thickness of about 6 to 188 $\mu$m is used.

Hard Coat Layer

The hard coat layer used in the present invention is a layer formed for the purpose of conferring strength on the anti-reflective film of the present invention. Accordingly, the hard coat layer may not be necessary depending on the intended use of the anti-reflective film.

The material for forming the hard coat layer is not particularly limited insofar as it is material which is transparent in the visible-light range and can confer strength on the anti-reflective film. For example, a UV curing acrylic hard coat, a thermosetting silicone coating etc. can be used.

The thickness of the hard coat layer used in the present invention is usually in the range of 1 to 30 $\mu$m. Further, the method of producing the hard coat layer can make use of a usual coating method and is not particularly limited.

Intermediate-refractive Layer

The intermediate-refractive layer in the present invention is a layer used for improving anti-reflective functions, and this layer is not always required similar to the hard coat layer. Such an intermediate-refractive layer is not particularly limited insofar as it is a layer made of a material being transparent in the visible-light range and having a refractive index in the range of 1.5 to 2.0. As the specific material for forming the intermediate-refractive layer, it is preferable to use a dispersion of fine particles of e.g. $Al_2O_3$, SiN, SiON, $ZrO_2$, $SiO_2$ or $ZnO_2$ in an organic silicon compound or the like. Further, the intermediate-refractive layer is not always required to be a single layer, and may be composed of a laminate of different layers so as to achieve the refractive index as a whole.

The present invention is not limited to the embodiments described above. These embodiments are described merely for illustrative purposes, and those having substantially the same constitution as in the technical idea described in the appended claims and demonstrating the same working effect fall under the scope of the present invention.

EXAMPLES

The present invention will be described in more detail by reference to the Examples.

Example 1

A titanium oxide film was formed on a polyethylene terephthalate (PET) film of 100 $\mu$m in thickness as the substrate polymeric film by means of the device shown in FIG. 1. Titanium tetraisopropoxide $Ti(i-OC_3H_7)_4$ gasified at 150° C. in a liquid-gasifying unit was used as the organic titanium compound gas, then mixed with an oxygen gas, and introduced via the starting-gas inlet into the reaction chamber. The flow rate of each of the organic titanium compound gas and the oxygen gas is as shown below. The plasma CVD device in FIG. 1 used in this example was a capacity coupling type, and an RF power source at 13.56 MHz was used as a power source of high frequency. The feed rate of the substrate polymeric film during continuous film formation was 10 m/min. Other conditions are shown below.

| <Film forming conditions> | |
| --- | --- |
| Applied electric power | 2 kW |
| Flow rate of titanium tetraisopropoxide gas | 100 sccm |
| Flow rate of oxygen gas | 1000 sccm |
| Surface temp. of the film forming drum (film forming temp.) | 0° C. |

The unit "sccm" for gas flow rate described above is an abbreviation of standard cubic cm per minute.

The measurement results of the titanium oxide film formed on the polyethylene terephthalate film under the following conditions are shown below.

| <Measurement results of the titanium oxide film> | |
| --- | --- |
| Film thickness | 233 nm |
| Film forming rate | 2330 nm · m/min |
| Composition | Ti:O:C = 27:53:20 |
| Refractive index ($\lambda$ = 550 nm) | 2.00 |
| The structure of the titanium oxide was amorphous. | |

<Device used for measuring the titanium oxide film>

Thickness measurement: Ellipsometer

Model: UVISEL™

Maker: JOBIN YVON

Composition analysis: Electron spectroscopy

Model: ESCALAB220i-XL

Maker: VG Scientific

Refractive index measurement: Ellipsometer

Model: UVISELL™

Maker: JOBIN YVON

Structural measurement: X-ray diffraction unit

Model: RINT 1500

Maker: Rikagaku Denki Co., Ltd.

As shown in the result of formation of the titanium oxide film, a uniform titanium oxide film with a refractive index of 2.00 could be formed at a film forming temperature of 0° C. on the polyethylene terephthalate film at a high film forming rate of 2330 nm-m/min. Further, as a result of measurement of this titanium oxide film by the ellipsometer, there was no problem of coloration with an extinction coefficient of 0.001 at $\lambda$=550 nm. In addition, the polyethylene terephthalate film after the titanium oxide film was formed thereon was in good conditions without slight elongation or deformation.

Example 2

A titanium oxide film was formed under the same conditions as in Example 1 except that the film forming temperature was 80° C. The device used for measuring the titanium oxide film was also the same as in Example 1. The results are shown below.

| <Measurement results of the titanium oxide film> | |
| --- | --- |
| Film thickness | 210 nm |
| Film forming rate | 2100 nm · m/min |
| Composition | Ti:O:C = 31:57:12 |
| Refractive index ($\lambda$ = 550 nm) | 2.23 |
| The structure of the titanium oxide was amorphous. | |

As shown in the result of formation of the titanium oxide film, a uniform titanium oxide film with a refractive index of 2.23 could be formed at a high film forming rate at a film forming temperature of 80° C. on the polyethylene terephthalate film. Further, since the titanium oxide film was formed at a lower temperature than the Tg (90° C.) of the polyethylene terephthalate film, the polyethylene terephthalate film after the titanium oxide film was formed thereon, was in good conditions without slight elongation or deformation.

Example 3

A titanium oxide film was formed under the same conditions as in Example 1 except that the film forming temperature was 100° C. The device used for measuring the titanium oxide film was also the same as in Example 1. The results are shown below.

| <Measurement results of the titanium oxide film> | |
|---|---|
| Film thickness | 205 nm |
| Film forming rate | 2050 nm · m/min |
| Composition | Ti:O:C = 31:58:11 |
| Refractive index (λ = 550 nm) | 2.25 |
| The structure of the titanium oxide was amorphous. | |

As shown in the result of formation of the titanium oxide film, a uniform titanium oxide film with a refractive index of 2.25 could be formed at a high film forming rate at a film forming temperature of 100° C. on the polyethylene terephthalate film. The polyethylene terephthalate film after the titanium oxide film was formed thereon, could be used with less elongation and deformation.

Comparative Example 1

A titanium oxide film was formed under the same conditions as in Example 1 except that the film forming temperature was −20° C. The device used for measuring the titanium oxide film was also the same as in Example 1. The results are shown below.

| <Measurement results of the titanium oxide film> | |
|---|---|
| Film thickness | 260 nm |
| Film forming rate | 2600 nm · m/min |
| Composition | Ti:O:C = 23:49:27 |
| Refractive index (λ = 550 nm) | 1.80 |
| The structure of the titanium oxide was amorphous. | |

The polyethylene terephthalate film after the titanium oxide film was formed thereon at a film forming temperature of −20° C., was not elongated or deformed. However, the refractive index of the titanium oxide film was 1.80, so it failed to attain the refractive index of 2.0 required for the highly refractive layer in the general anti-reflective layer, thus making its use inappropriate. This is because a refractive index of less than 2.0 indicates the incomplete formation of the titanium oxide film and thus the film does not satisfy the required criteria of the anti-reflective film as a product.

Comparative Example 2

A titanium oxide film was formed under the same conditions as in Example 1 except that the film forming temperature was 200° C. The device used for measuring the titanium oxide film was also the same as in Example 1. The results are shown below.

| <Measurement results of the titanium oxide film> | |
|---|---|
| Film thickness | 195 nm |
| Film forming rate | 1950 nm · m/min |
| Composition | Ti:O:C = 34:61:5 |
| Refractive index (λ = 550 nm) | 2.39 |
| The structure of the titanium oxide was amorphous. | |

As shown in the result of formation of the titanium oxide film, a titanium oxide film with a refractive index of 2.39 could be formed at a film forming temperature of 200° C. on the polyethylene terephthalate film, however the results were not good because the substrate polyethylene terephthalate film was significantly elongated and deformed.

The above results are collectively shown in Table 1.

TABLE 1

| Sample | Film forming temperature (° C.) | Elongation and deformation of polymeric film | Refractive index of titanium oxide film | Comprehensive estimate |
|---|---|---|---|---|
| Comparative Example 1 | −20 | ◎ | X | X |
| Example 1 | 0 | ◎ | ◎ | ◎ |
| Example 2 | 80 | ◎ | ◎ | ◎ |
| Example 3 | 100 | ○ | ◎ | ○ |
| Comparative Example 2 | 200 | X | ◎ | X |

Note)
The material of the polymeric film in the Table is polyethylene terephthalate (Tg, 90° C.)
Elongation and deformation of the polymeric film
◎: None of slight elongation or deformation.
○: Usable with slight elongation and deformation.
X: Significant elongation and deformation.
Refractive index of the titanium oxide film
◎: 2.0 or more
X: less than 2.0

As can be seen from Table 1, the refractive index of the titanium oxide film formed under the condition of a film forming temperature of −10 to 150° C. is 2.0 or more, to satisfy 2.0 or more which is required for the highly refractive layer in the general anti-reflective layer, and the substrate polymeric film was also not problematic with less elongation and deformation. Further, the sample having the titanium oxide film formed at a film forming temperature of from −10° C. or more to a lower temperature than the Tg (90° C.) of polyethylene terephthalate used as the polymeric film was excellent with a refractive index of 2.0 or more with no slight elongation or deformation of the substrate polymeric film, to provide a particularly preferable sample.

In the sample having the film formed at a temperature of less than −10° C., the resulting titanium oxide film had a low refractive index (1.80) and was inappropriate as a highly refractive layer for the anti-reflective film. Further, in the sample having the film formed at a temperature of more than 150° C., the substrate polymeric film was elongated and significantly deformed by heat, so it was not appropriate for use.

Example 4

Figure 5:
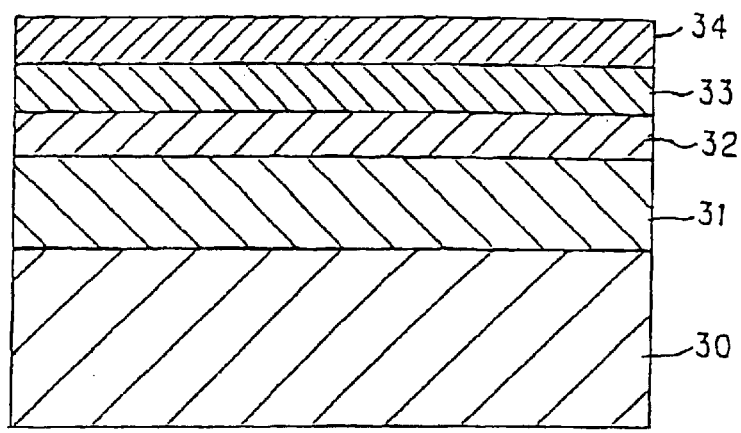
FIG. 5 is a schematic sectional view of the anti-reflective film in Example 4.

As shown in FIG. 5, a hard coat layer 31, an intermediate-refractive layer 32, a highly refractive layer 33 and a low-refractive layer 34 were formed on a polymeric film 30, to form an anti-reflective film. The conditions for forming each layer are shown below.

<Polymeric film (30)>
  Thickness of the polyethylene terephthalate film: 100 μm
<Hard coat layer (31)>
  UV ray curing resin PET-D31 (Dainichiseika Colour & Chemicals Mfg. Co., Ltd.)

| Formation: coating | |
|---|---|
| UV ray curing condition | 480 mJ |
| Thickness | 6 μm |

<Intermediate-refractive layer (32)>
  $ZrO_2$ fine particle coating liquid No. 1221
  A coating solution (Sumitomo Osaka Cement Co., Ltd.) having 0.3 part by weight of a binder (ionization irradiation curing organic silicon compound) added to 100 parts by weight of ZrO$_2$ fine particles.

| Formation: wire bar coating | |
|---|---|
| UV ray curing condition | 480 mJ |
| Thickness | 88 μm |

Figure 6:
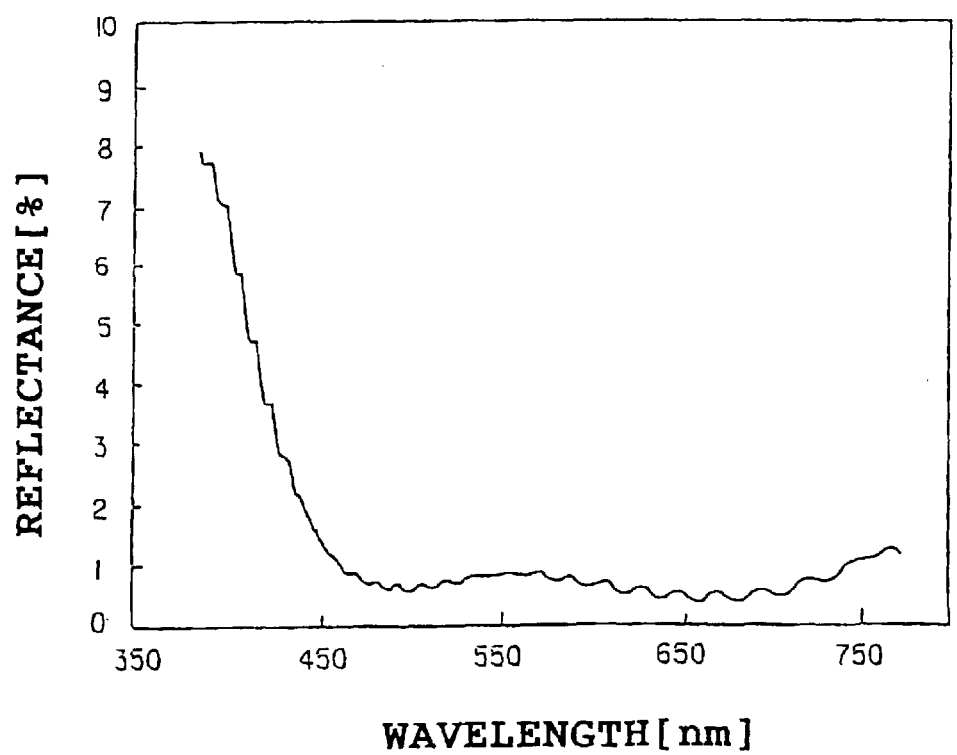
FIG. 6 shows the reflective spectral characteristics of the anti-reflective film in Example 4.

<Highly refractive layer (33)>
Formed under the same conditions as in Example 2.
<Low-refractive layer (34)>
The SiO$_2$ layer was formed by plasma CVD method.
The anti-reflective film formed under the conditions described above was in good conditions without slight elongation or deformation of the polymeric film. The reflective spectral characteristics of the anti-reflective film formed under the conditions described above are shown in FIG. 6. As can be seen from FIG. 6, its refractive index in the vicinity of 550 nm easily perceived by humans was low, indicating good anti-reflective effect. The luminous reflection factor indicated a good value of 0.7%.

The spectral reflectance was determined using the following device.

Spectral reflectance measurement: Spectrophotometer

Model: UV-3100PC

Maker: Shimadzu Corporation

Comparative Example 3

An anti-reflective film was prepared under the same conditions as in Example 4 except that the conditions for forming the highly refractive layer 33 shown in FIG. 5 were the same as in Comparative Example 1.

Figure 7:
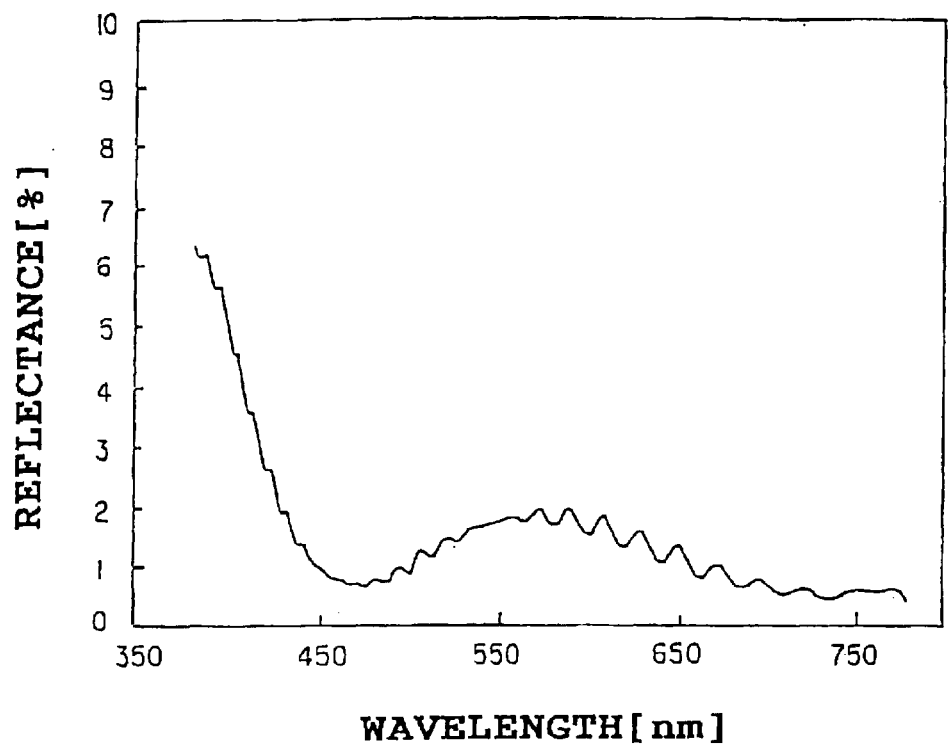
FIG. 7 shows the reflective spectral characteristics of the anti-reflective film in Comparative Example 3.

The anti-reflective film formed under the conditions described above was in good conditions without slight elongation or deformation of the polymeric film. However, as shown in FIG. 7, the reflection factor in the vicinity of 550 nm easily perceived by humans was high, indicating inferior anti-reflective effect. The luminous reflection factor was as high as 1.6% and not appropriate.

Example 5

In Example 5, the device shown in FIG. 2 was used. In Example 5, a film having a 6 μm hard coat and an 88 μm intermediate-refractive layer coated successively on polyethylene terephthalate (PET) with a thickness of 100 μm was used. Further, a titanium oxide film was formed in the reaction chamber a, while a silica film was formed in the reaction chambers b and c shown in FIG. 2. An RF power source at 13.56 MHz was used as the power source of high frequency. The feed rate of the polymeric film as the substrate for continuous film forming was 20 m/min. The other conditions are as shown below.
<Conditions for forming the titanium oxide film (reaction chamber a)>

| | |
|---|---|
| Applied electric power | 30 kW |
| Pressure | 50 mTorr |
| Flow rate of titanium tetraisopropoxide gas | 1 slm |
| Flow rate of oxygen gas | 10 slm |
| Surface temp. of film forming drum (film forming temp.) | −20° C. |

<Conditions for forming the silica film (reaction chambers b and c)>

| | |
|---|---|
| Applied electric power | 30 kW |
| Pressure | 50 mTorr |
| Flow rate of HMDS | 1 slm |
| Flow rate of oxygen gas | 10 slm |
| Surface temp. of film forming drum (film forming temp.) | −20 ° C. |

The unit "slm" for gas flow rate described above is an abbreviation of standard liter per minute.

Figure 8:
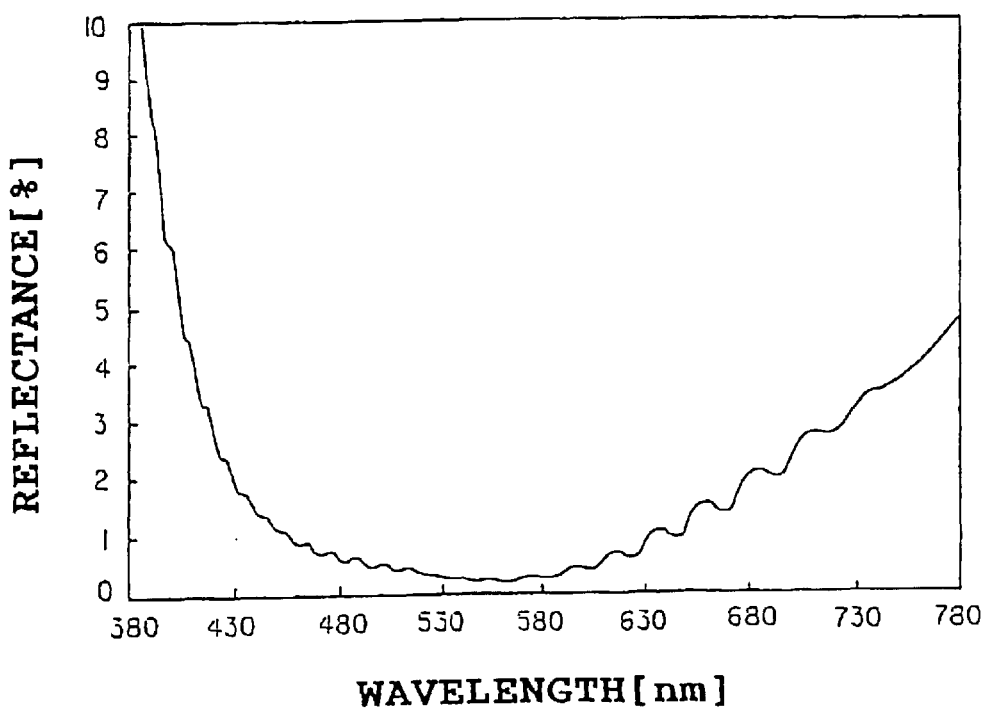
FIG. 8 shows the reflective spectral characteristics of the laminated film in Example 5.

The measurement results of the laminated film formed on the substrate film under the conditions described above are shown below.
<Measurement results of the laminated film>
The layer structure of the laminated film is shown in FIG. 3. The luminous reflection factor as determined from a reflection spectrum of the laminated film was 0.39%. The reflection spectrum is shown in FIG. 8.

The substrate film was in good conditions without slight elongation or deformation. Further, when the respective films constituting the laminated film were examined in a peel test, it was found that all the layers had adhesion strength of not less than 1 kg/cm.

furthermore, the substrate film having the laminated film formed thereon in this example was attached to LCD, and it was visually confirmed that the reflection thereon by illumination etc. was decreased.

Example 6

A laminated film was formed in the same manner as in Example 5 by using the plasma CVD device shown in FIG. 2. In this example, polyethylene terephthalate (PET) of 100 μm in thickness was used as the substrate. In this example unlike Example 5, a titanium oxide film was formed on each of the 3 reaction chambers (a, b, c) and then a silica film was formed in each of the reaction chambers. This step was repeated twice to form a laminated film consisting of titanium oxide film-silica film-titanium oxide film-silica film.

Figures 9, 10:
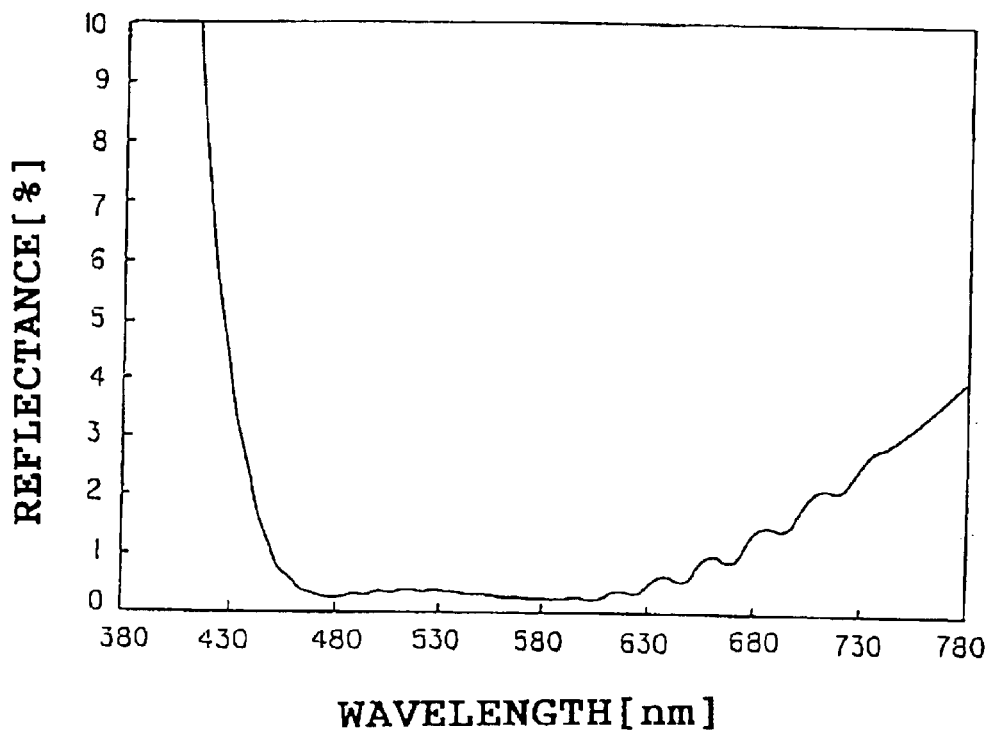
FIG. 9 shows the reflective spectral characteristics of the laminated film in Example 6.
FIG. 10 is a schematic sectional view showing the constitution of the laminated film in Comparative Example 5.

The respective conditions for forming the titanium oxide film and the silica film were the same as in Example 5.
<Measurement results of the laminated film>
The layer structure of the laminated film is shown in FIG. 4. The thickness of each film had been regulated by controlling the feed rate of the substrate film. The luminous reflection factor of the laminated film, as determined by the reflection spectrum in FIG. 4, was 0.35%. The reflection spectrum of the laminated film is shown in FIG. 9. The substrate film was in good conditions without slight elongation or deformation.

Further, the respective films constituting the laminated film were examined in a peel test, indicating that all the layers had an adhesion strength of not less than 1 kg/cm.

Then, the substrate film having the laminated film formed thereon in this example was attached to LCD, and it was visually confirmed that the reflection thereon by illumination was decreased, and the same result as in Example 5 was thus obtained.

Comparative Example 4

An anti-reflective film having the same layer structure (see FIG. 3) as in Example 5 was formed by thermal CVD method. The starting materials for film forming were the same starting materials as in Example 5, and the temperature of the film forming chamber was 400° C.

However, the substrate film was deformed by heat, thus failing to form the anti-reflective film.

Comparative Example 5

An anti-reflective film having the same layer structure (see FIG. 3) as in Example 5 was formed by sputtering. The film forming rate was about 50 nm/min. for the titanium oxide film and about 100 nm/min. for the silica film.

Figures 11, 12:
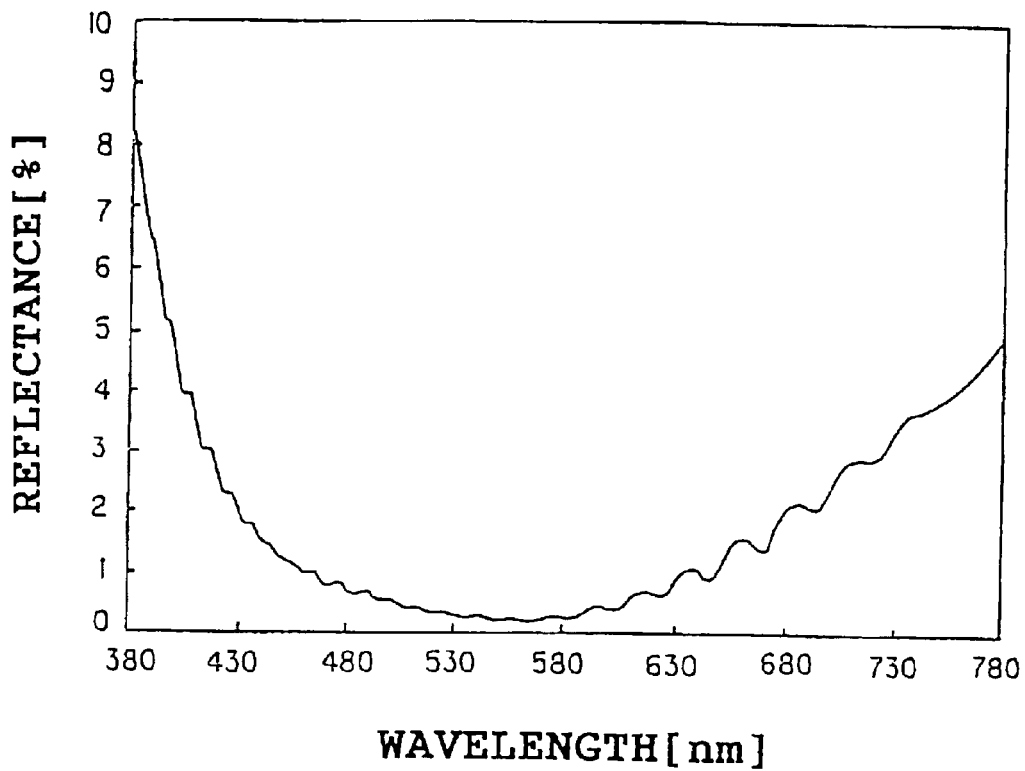
FIG. 11 shows the reflective spectral characteristics of the laminated film in Comparative Example 5.
FIG. 12 is a schematic sectional view showing the constitution of the laminated film in Comparative Example 6.

The layer structure formed by the sputtering method is shown in FIG. 10, and its reflection spectrum is shown in FIG. 11.

When FIG. 10 is compared with FIG. 3, it is understood that almost the same layer structure as in the Examples in the present invention can be formed by sputtering. However, the luminous reflection factor, as determined from the reflection spectrum shown in FIG. 11, indicated that this index was 0.39 in Example 5 in the present invention, while it was 0.41 for the film formed by sputtering. Further, when the respective layers were examined in a peel test, each layer formed in Example 5 in the present invention had an adhesion strength of not less than 1 kg/cm, while the layer formed by sputtering was as low as about 550 g/cm.

Accordingly, it was found that an anti-reflective film having almost the same layer structure as in the Examples in the present invention can be formed by sputtering, however the anti-reflective film to be formed is inferior in performance to the anti-reflective film of the present invention.

Comparative Example 6

An anti-reflective film having the same layer structure (see FIG. 3) as in Example 5 was formed by vacuum deposition. $Ti_2O_3$ and $SiO_2$ were used as the starting materials. The film forming rate was about 100 nm/min. for the titanium oxide film and about 200 nm/min. for the silica film.

Figure 13:
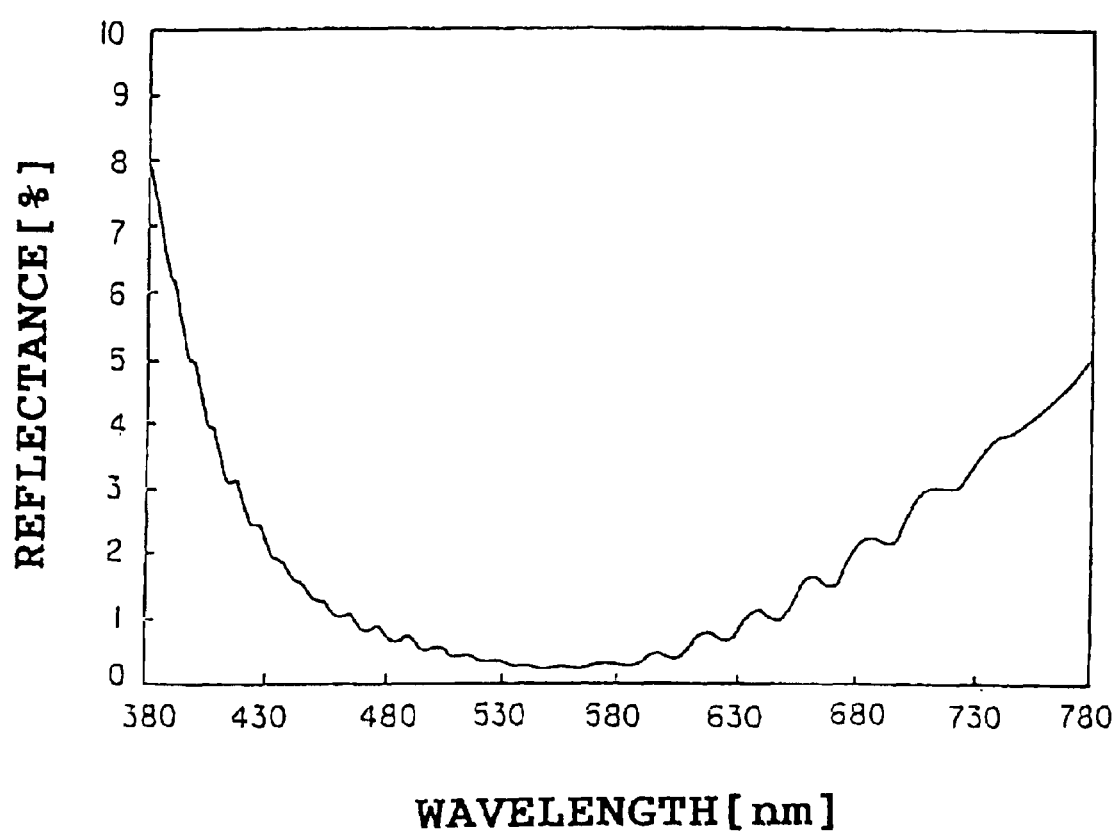
FIG. 13 shows the reflective spectral characteristics of the laminated film in Comparative Example 6.

The layer structure formed by this vacuum deposition is shown in FIG. 12, and its reflection spectrum is shown in FIG. 13.

From FIG. 12, it is understood that almost the same layer structure as in Example 5 in the present invention can be formed by this vacuum deposition similar to the sputtering method described above. However, the luminous reflection factor, as determined from the reflection spectrum shown in FIG. 13, indicated that this index was 0.39 in Example 5 in the present invention, while it was 0.41 for the film formed by vacuum deposition. Further, when the respective layers were examined in a peel test, each layer formed in Example 5 in the present invention had an adhesion strength of not less than 1 kg/cm, while the layer formed by vacuum deposition was as low as about 200 g/cm.

Accordingly, it was found that an anti-reflective film having almost the same layer structure as in Example 5 in the present invention can be formed by vacuum deposition, however the anti-reflective film, similar to the film formed by the sputtering method described above, is inferior in performance to the anti-reflective film of the present invention.

As is evident from the Examples and Comparative Examples, the substrate polymeric film is not elongated or deformed while the highly refractive layer has a high refractive index so that an anti-reflective film having high anti-reflective effect can be obtained in the Examples in the present invention.

The thickness of each layer in the laminated film formed in the Examples and Comparative Examples was set such that the luminous reflection factor came to be minimum in consideration of the optical characteristics of each layer. For example, in the highly refractive index layer and the low-refractive index layer in Example 4, the desired thickness is achieved by regulating the feed rate of the film in forming each layer by the device shown in FIG. 1.

What is claimed is:

1. A method of producing an anti-reflective film comprising at least one layer of titanium oxide and at least one layer of silica film formed respectively on a polymeric film selected from a monoaxially or biaxially oriented polyester film or a triacetyl cellulose film in a plasma CVD device including at least a reaction chamber in which a starting gas is introduced, a film forming drum capable of temperature control, and a plasma generating means for generating plasma between the plasma generating means and the film forming drum regulated a temperature in the range of −10 to 150° C., wherein a webbed polymeric film is continuously conveyed by the film forming drum to the reaction chamber having starting gas introduced into it thereby controlling the temperature of the polymeric film in the range of −10 to 150° C. and simultaneously forming an anti-reflective film.

2. A method of producing an anti-reflective film according to claim 1, wherein a plurality of the reaction chambers is arranged along an outer periphery of the film forming drum.

3. A method of producing an anti-reflective film according to claim 1, wherein the titanium oxide film is formed by plasma CVD method on the polymeric film and the silica film is laminated by plasma CVD method on the face of said titanium oxide film formed.

4. A method of producing an anti-reflective film according to claim 1, wherein a hard coat layer is formed on the polymeric film, and the titanium oxide film and the silica film are laminated in this order on said hard coat layer.

5. A method of producing an anti-reflective film according to claim 1, wherein an intermediate-refractive layer is formed between the hard coat layer and the titanium oxide film.

6. A method of producing an anti-reflective film according to claim 1, wherein the silica layer is the outermost layer.

* * * * *